(12) United States Patent
Seino

(10) Patent No.: US 6,400,237 B1
(45) Date of Patent: Jun. 4, 2002

(54) PHASE COMPENSATION CIRCUIT, FREQUENCY CONVERTER DEVICE AND ACTIVE PHASED ARRAY ANTENNA

(75) Inventor: Kiyoharu Seino, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/443,285

(22) Filed: Nov. 19, 1999

(30) Foreign Application Priority Data

Nov. 26, 1998 (JP) .......................................... 10-335538
May 17, 1999 (JP) .......................................... 11-135810

(51) Int. Cl.[7] .............................. H01P 1/18; H03H 7/38
(52) U.S. Cl. ...................................... 333/156; 333/139
(58) Field of Search ................................ 333/156, 139, 333/164, 174

(56) References Cited

U.S. PATENT DOCUMENTS 6,100,757 A * 8/2000 Kotzamanis ................ 330/151
6,184,755 B1 * 2/2001 Barber et al. ............... 331/181

FOREIGN PATENT DOCUMENTS

| JP | 60-10907 | 1/1985 |
| JP | 7-226601 | 8/1995 |
| JP | 9-74325 | 3/1997 |

OTHER PUBLICATIONS

Sharma, Arvind K., "Solid–State Control Devices: State of the Art", 1989, pp. 95–112, Microwave Journal, 1989 State of the Art Reference.

* cited by examiner

Primary Examiner—Robert J. Pascal
Assistant Examiner—Kimberly E Glenn
(74) Attorney, Agent, or Firm—Burns, Doane, Swecker & Mathis, LLP

(57) ABSTRACT

A phase compensation circuit includes two first inductive elements connected in series with a main line through which a signal is passed, a series circuit consisting of a capacitor and a variable capacity element which are provided between a connecting point between the first inductive elements and ground, a second inductive element connected in parallel with the series circuit, and a choke circuit connected between the capacitor and the variable capacity element of the series circuit.

19 Claims, 10 Drawing Sheets

PHASE COMPENSATION CIRCUIT, FREQUENCY CONVERTER DEVICE AND ACTIVE PHASED ARRAY ANTENNA

BACKGROUND OF THE INVENTION

1. Field of the Invention

The present invention relates to a phase compensation circuit which is incorporated into a radar system or a communication system in a microwave band to compensate change in phase due to the temperature of these devices, and a frequency converter device using the phase compensation circuit, and an active phased array antenna using the phase compensation circuit or the frequency converter device.

2. Description of the Related Art

In the radar system, the communication system, etc., the active phased array antenna consisting of a plurality of element antennas is employed as the antenna used therein from viewpoints such as reliability and a high speed operation, and also a transmitting module or a receiving module for amplifying or controlling the signal is employed in each element antenna.

Since the modules each has uniform phase including a temperature characteristic are requested particularly as these modules, normally the phase shifter for compensating variation in phase is incorporated in each module.

FIG. 15 is a view showing the phase shifter in the prior art, which is disclosed in the MICROWAVE JOURNAL, 1989, STATE OF ART REFERENCE, pp. 109, for example. In FIG. 15, 1 is a coupler; 2, an input terminal; 3, an output terminal; 4, a coupling terminal; 5, a passing terminal; 6, a capacitor; 7, a variable capacity element; 8, a choke circuit; and 9, a direct current power supply.

In this phase shifter, a series circuit of the capacitor 6 and the variable capacity element 7 is provided between the coupling terminal 4 of a coupler 1 having four terminals and ground and the passing terminal of the coupler 1 and ground respectively. Then, in order to apply a desired bias from the direct current power supply 9 to each variable capacity element 7, the choke circuit 8 is connected to the variable capacity element 7.

Also, a coupler such as a branch line coupler, an interdigital coupler, or the like, which can distribute the microwave signal to the coupling terminal 4 and the passing terminal 5 at the same amplitude to have phase difference of 90 degree between both terminals, is employed as the coupler 1. Also, a varactor diode, an FET (Field Effect Transistor), or the like, whose capacitance is changed depending on its applied voltage, is employed as the variable capacity element 7. Further, in order not to affect the microwave characteristic of the phase shifter as much as possible, the choke circuit 8 is designed to have a high impedance in a desired frequency band. Moreover, the capacitor 6 for preventing the direct current is selected to have a value which can yield as low impedance as possible in the microwave band.

Next, an operation of the phase shifter will be explained hereunder. The microwave signal which is input from the input terminal 2 is distributed to the coupling terminal 4 and the passing terminal 5 to have the same amplitude and the phase difference of 90 degree between both terminals respectively. The distributed microwave signal is supplied to the variable capacity element 7 via the capacitor 6. Normally the impedance of the variable capacity element 7 substantially consists of a reactance component only since its resistance component is small, and therefore the microwave signal supplied to the variable capacity element 7 is totally reflected there toward the coupler 1 side. In addition, the reflected microwave signals are synthesized oppositely in phase at the input terminal 2 and also synthesized commonly in phase at the output terminal 3, and as a result such microwave signal fully appears on the output terminal 3.

In this case, the phase of the microwave signal being reflected by the variable capacity element 7 largely depends upon a capacitance of the variable capacity element 7. Thus, the larger a degree of change in the capacitance is increased, the larger a degree of change in the phase is increased.

FIGS. 16A to 16C show an example of the microwave characteristic of the phase shifter shown in FIG. 15. In general, the capacitance of the variable capacity element 7 is decreased smaller as the voltage VR of the direct current power supply 9 applied to the variable capacity element 7 is increased higher, so that the phase of the reflected microwave signal leads.

Therefore, as shown in FIG. 16A, the phase shifter shows the right-upward inclined phase characteristic if an angular frequency ω is kept constant. Also, as shown in FIG. 16B, VSWR at the input terminal 2 does not depend on the voltage VR and thus shows the good value since the reflected microwave signals are always synthesized oppositely in phase at the input terminal 2. Further, as shown in FIG. 16C, the frequency characteristic of VSWR always shows the good value if the voltage VR is kept constant.

The phase of the microwave signal from the input terminal 2 to the output terminal 3 can be changed by varying the voltage VR of the direct current power supply 9 in this manner. For this reason, even though the phase characteristics of the amplifier, the mixer, etc. employed in the individual transmitting module or receiving module relative to the temperature are different, the phase compensation can be achieved by using this phase shifter. As a result, the transmitting modules or the receiving modules which can suppress the change in phase relative to the temperature and have the uniform phase characteristic can be implemented.

FIG. 17 is a block diagram showing one constituent element of an active phased array antenna to which the transmitting module having the phase shifter in the prior art shown in FIG. 15 is applied. In FIG. 17, a reference 10 denotes a gain compensation circuit using a variable attenuator; 11, a phase shifter in the prior art; 12, a high-frequency amplifier using semiconductor; 13, a transmitting module which consists of the gain compensation circuit 10, the phase shifter 11, and the high-frequency amplifier 12; and 14, an element antenna.

Therefore, the signal input from the input terminal 2 is passed through the gain compensation circuit 10 and the phase shifter 11, then amplified by the high-frequency amplifier 12, and then irradiated into a space from the element antenna 14.

A large number of constituent elements, each consists of such transmitting module 13 and the element antenna 14, are employed in the active phased array antenna. Thus, a very high output can be obtained by spatially synthesizing the signal which is transmitted from the element antenna 14.

In this case, the active phased array antenna for transmission is disclosed herein. A large number of receiving modules and the element antennas 14 are also employed in the active phased array antenna for reception.

According to the phase shifter in the prior art shown in FIG. 15, since the interdigital coupler is normally employed as the coupler 1, the wideband characteristic of about 1 octave can be derived.

However, such wideband is not necessary for the transmitting modules 13 or the receiving modules which are employed in the active phased array antenna. In many cases, the lower cost and the reduction in size of the module are requested rather than the wider bandwidth. In the phase shifter 11 in the prior art, there has been such a problem that, since two expensive variable capacity elements 7 are needed and also the coupler 1 having a length of ¼λ in the predetermined frequency band is employed, the cost and the size of the transmitting modules 13 or the receiving modules are increased.

Further, there has been another problem that the cost and the weight of the active phased array antenna, to which the transmitting modules 13 or the receiving modules are applied, are increased.

SUMMARY OF THE INVENTION

The present invention has been made to overcome above subjects and it is an object of the present invention to provide a phase compensation circuit which is capable of compensating the phase relative to the temperature with a simple configuration employing one variable capacity element, and a frequency converter device using the phase compensation circuit, and an active phased array antenna to which the phase compensation circuit or the frequency converter device is applied.

The phase compensation circuit according to a first aspect of the invention comprises two first inductive elements connected in series with a main line through which a signal is passed; a series circuit consisting of a capacitor and a variable capacity element, which are provided between a connecting point between the first inductive elements and ground; a second inductive element connected in parallel with the series circuit; and a choke circuit connected between the capacitor and the variable capacity element of the series circuit.

Also, in the phase compensation circuit according to a second aspect of the invention, an inductive element whose inductance can be varied is employed as the second inductive element.

Also, the phase compensation circuit according to a third aspect of the invention further comprises a third inductive element provided between the capacitor and the variable capacity element of the phase compensation circuit disclosed in the above first invention.

Also, the phase compensation circuit according to a fourth aspect of the invention comprises a series circuit consisting of a capacitor and a variable capacity element, which are provided between a main line through which a signal is passed and ground; a choke circuit connected between the capacitor and the variable capacity element of the series circuit; an inductor connected in series with the main line; and a capacitor provided between the inductor and ground.

Also, the phase compensation circuit according to a fifth aspect of the invention comprises a series circuit consisting of a ¼λ line, a capacitor, an impedance compensation line, and a variable capacity element, which are provided between a main line through which a signal is passed and ground; and a choke circuit connected between the impedance compensation line and the variable capacity element of the series circuit.

Also, the phase compensation circuit according to a sixth aspect of the invention comprises a series circuit consisting of an inductive line, a capacitor, an impedance compensation line, and a variable capacity element, which are provided between a main line through which a signal is passed and ground; a capacitive element connected to the inductive line; and a choke circuit connected between the impedance compensation line and the variable capacity element of the series circuit.

Also, the frequency converter device according to a seventh aspect of the invention comprises the phase compensation circuit which is set forth in any one of claims 1 to 6 and employed in a local signal system of the frequency converter device.

Also, the active phased array antenna according to an eighth aspect of the invention comprises transmitting modules or receiving modules each of which includes the phase compensation circuit set forth in any one of above respective aspects of the invention.

Also, the active phased array antenna according to the ninth invention comprises the frequency converter device set forth in the seventh aspect of the invention.

DETAILED DESCRIPTION OF THE PREFERRED EMBODIMENTS

Embodiment 1

Figure 1:
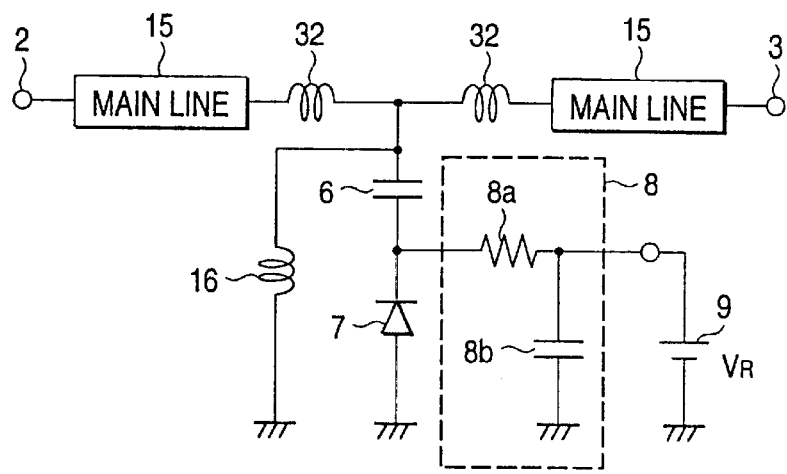
FIG. 1 is a view showing a phase compensation circuit according to an embodiment 1 of the present invention.

FIG. 1 is a view showing a phase compensation circuit according to an embodiment 1 of the present invention. A reference 2 denotes an input terminal; 3, an output terminal; 6, a capacitor; 7, a variable capacity element; 8, a choke circuit; 9, a direct current power supply; 15, a main line; 16, a second inductive element; and 32, a first inductive element.

In this phase compensation circuit, two first inductive elements 32 are loaded on the main line 15 through which the microwave signal is transmitted, then a series circuit consisting of the capacitor 6 and the variable capacity element 7 is provided between a connecting point of these inductive elements 32 and ground, then the second inductive element 16 is connected in parallel with the series circuit, and then the choke circuit 8 for applying a desired bias voltage from the direct current power supply 9 to the variable capacity element 7 is connected between the capacitor 6 and the variable capacity element 7.

The first inductive element 32 and the second inductive element 16 are composed of a lumped inductor or a transmission line whose length is shorter than ¼λ, respectively. In addition, in order to achieve the reduction in size and the high impedance characteristic, an L-shaped circuit consisting of a resistor 8a with high resistance and a capacitor 8b, as shown in FIG. 1, for example, is employed as the choke circuit 8.

Figure 2A:
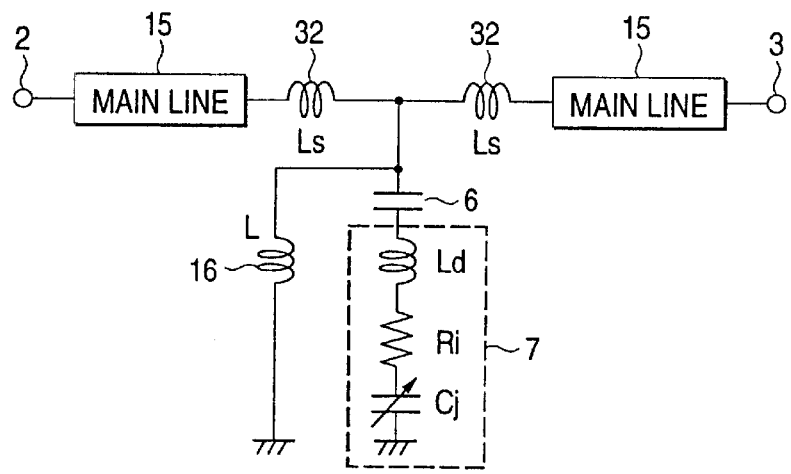
FIGS. 2A and 2B are views showing an equivalent circuit of the phase compensation circuit in the embodiment 1 of the present invention.
Figure 2B:
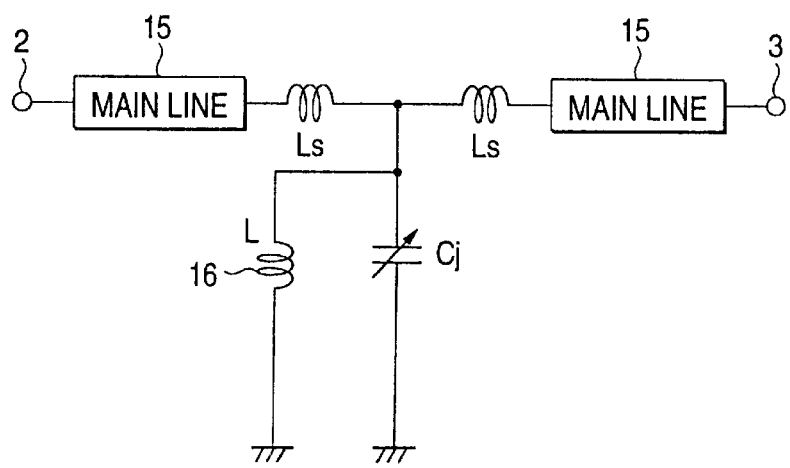

FIGS. 2A and 2B are views showing an equivalent circuit of the phase compensation circuit in the embodiment 1, respectively. Since the choke circuit 8 is designed so as to attain the high impedance characteristic, it can be omitted from the equivalent circuit. Hence, as shown in FIG. 2A, the equivalent circuit can be expressed by two first inductive elements 32, a series circuit of the capacitor 6 and the variable capacity element 7 which are provided between a connecting point of these first inductive elements 32 and ground, and the second inductive element 16 which is connected in parallel with the series circuit. If a varactor diode is employed as the variable capacity element 7, as shown in FIG. 2A, the variable capacity element 7 can be expressed by a series circuit which consists of an inductance Ld due to a bonding wire, a series resistance Ri, and a junction capacitance Cj.

In general, Ld and Ri of the variable capacity element 7 are made sufficiently small, and a value of the capacitor 6 is selected so as to yield the sufficiently low impedance. Therefore, the equivalent circuit shown in FIG. 2A can be further simplified. Thus, as shown in FIG. 2B, the equivalent circuit can be expressed by two inductance Ls due to the first inductive elements 32, and a parallel circuit which is provided between a connecting point of Ls's and ground and which consists of an inductance L of the second inductive element 16 and the junction capacitance Cj of the variable capacity element 7.

In FIG. 2B, a transmission coefficient T of the microwave signal which passes from the input terminal 2 to the output terminal 3, and a reflection coefficient Λ and VSWR of the microwave signal at the input terminal 2 can be expressed by following equations., respectively.

$$T = \frac{2}{2 + \frac{2Ls}{L} - 2\omega^2 LsCj + j\frac{\omega Ls}{Z0}\left(2 + \frac{Ls}{L} + \omega^2 LsCj\right) + jZl\left(\omega Cj - \frac{1}{\omega L}\right)}$$ [Formula 1]

$$\Gamma = \frac{j\frac{\omega Ls}{Z0}\left(2 + \frac{Ls}{L} + \omega^2 LsCj\right) - jZ0\left(\omega Cj - \frac{1}{\omega L}\right)}{2 + \frac{2Ls}{L} - 2\omega^2 LsCj + j\frac{\omega Ls}{Z0}\left(2 + \frac{Ls}{L} + \omega^2 LsCj\right) + jZ0\left(\omega Cj - \frac{1}{\omega L}\right)}$$ [Formula 2]

$$VSWR = \frac{1 + |\Gamma|}{1 - |\Gamma|}$$ [Formula 3]

Where Z0 is a power supply impedance connected to the input terminal 2, or a load impedance connected to the output terminal 3, or a characteristic impedance of the main line 15. Normally Z0 is selected as 50 ohm.

Figure 3:
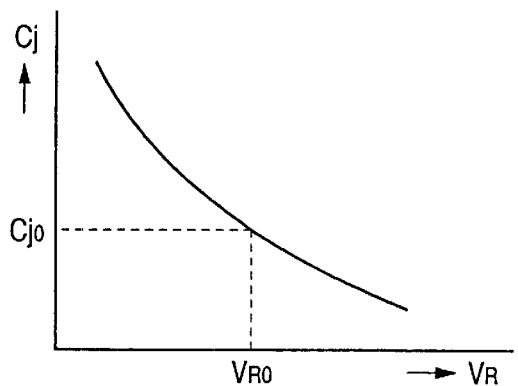
FIG. 3 is a graph showing an example of a characteristic of a junction capacitor of a variable capacity element relative to an applied voltage.

FIG. 3 shows an example of the junction capacitance Cj of the variable capacity element 7 relative to the voltage VR which is applied from the direct current power supply 9 to the variable capacity element 7. As described in the prior art, the junction capacitance Cj is reduced as the voltage VR is increased. In FIG. 3, Cj0 is a junction capacitance of the variable capacity element 7 which parallel-resonates with the inductance L of the second inductive element 16 at a predetermined angular frequency ω0, and VR0 is a voltage of the direct current power supply 9 required to obtain Cj0.

Figure 4A:
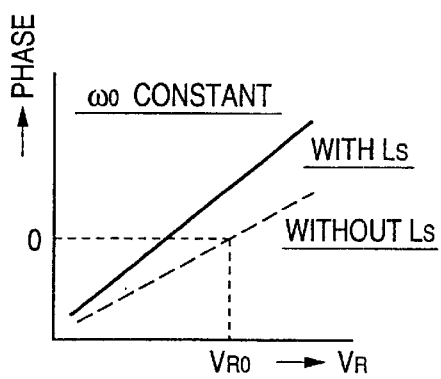
FIGS. 4A to 4C are views showing an example of a microwave characteristic of the phase compensation circuit in the embodiment 1 of the present invention.
Figure 4B:
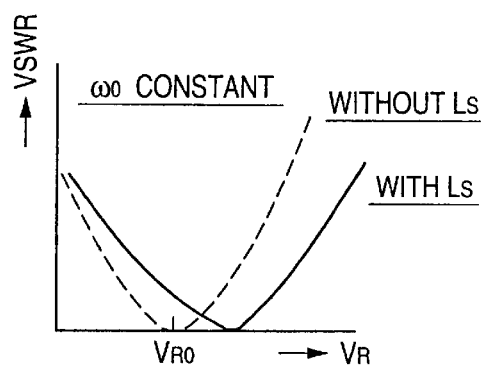
Figure 4C:
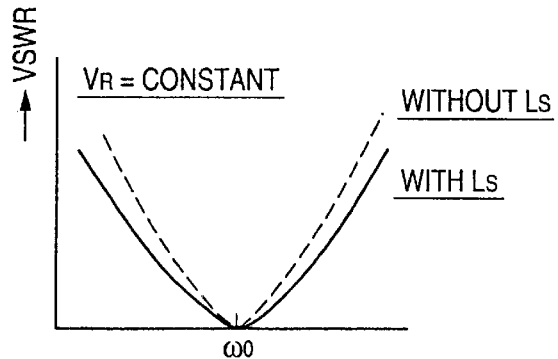

FIGS. 4A to 4C show an example of the microwave characteristic of the phase compensation circuit in the embodiment 1 of the present invention. In FIGS. 4A to 4C, a solid line indicates a phase characteristic when the first inductive elements 32 are provided, while a broken line indicates a phase characteristic when the first inductive elements 32 are not provided. FIG. 4A shows the phase characteristic if the angular frequency ω0 is kept constant but the voltage VR is changed. In case the first inductive elements 32 are provided, as evident from Formula 1, the phase leads as the voltage VR is increased, i e., the junction capacitance Cj is reduced. As a result, the rapidly right-upward inclined phase characteristic can be achieved as indicated by the solid line. On the contrary, in case the first inductive elements 32 are not provided, as indicated by the broken line, phase difference between the input terminal 2 and the output terminal 3 becomes 0 at the voltage VR0 by which Cj0 of the variable capacity element 7 to parallel-resonate with the second inductive element 16 can be obtained. If the voltage VR is further increased, the phase leads much more. As a result, the gently right-upward inclined phase characteristic can be achieved, like the case where the first inductive elements 32 are provided.

In this manner, the large change in phase relative to the voltage VR can be attained-by attaching the first inductive elements 32.

FIG. 4B shows the VSWR characteristic if the angular frequency ω0 is kept constant but the voltage VR is changed. In case the first inductive elements 32 are provided, as evident from Formulae 2 and 3, the VSWR is reduced as the voltage VR is increased, and then the VSWR is reduced to the minimum in the vicinity of VR0 at which the parallel resonance of the second inductive element 16 and the variable capacity element 7 is caused. Then, the VSWR tends to increase if the voltage VR is further increased, so that the V-shaped characteristic shown in FIG. 4B can be derived. In contrast, the similar characteristic can be derived in the case where the first inductive elements 32 are not provided, nevertheless the degradation of VSWR relative to the change of VR can be suppressed by attaching the first inductive elements 32.

FIG. 4C shows the frequency characteristic of VSWR if the VR0 is kept constant. The VSWR is reduced to the minimum in the vicinity of the frequency ω0 at which the parallel resonance of the second inductive element 16 and the variable capacity element 7 is caused. Thus, the V-shaped characteristic can be derived as shown in FIG. 4B, nevertheless the degradation of VSWR relative to the frequency can be suppressed by attaching the first inductive elements 32.

In this way, in the phase compensation circuit, the phase can be changed by varying the voltage of the direct current power supply 9 applied to the variable capacity element 7. In particular, in the phase compensation circuit, the parallel resonance of the second inductive element 16 and the variable capacity element 7 is utilized so as to reduce the size and also the first inductive elements 32 are attached so as to suppress the degradation of VSWR. As a result, the excellent VSWR characteristic can be achieved in the narrow bandwidth.

Accordingly, the phase characteristics of a high-frequency amplifier 12, a mixer, etc. employed in the transmitting module 13 or the receiving module relative to the temperature are varied like the phase shifter 11 in the prior art, the phase compensation can be effected by applying the phase compensation circuit to the transmitting module 13 or the receiving module, which is used for the active phased array antenna and in which the wide band is not needed. As a consequence, the transmitting modules 13 or the receiving modules having the uniform phase characteristic can be obtained.

As described above, the phase compensation circuit of the present invention can consist of one variable capacity element 7, the first inductive elements 32 which show ¼λ in the predetermined frequency band, and the second inductive element 16. Therefore, since the coupler 1 which shows ¼λ in the predetermined frequency band and two variable capacity elements 7 are not needed unlike the phase shifter 11 in the prior art, the lower cost and the size reduction of the phase compensation circuit can be accomplished.

Therefore, such an advantage can be achieved that, if the phase compensation circuit of the present invention is utilized so as to compensate the change in phase of the transmitting module 13 or the receiving module relative to the temperature, the lower cost and the size reduction of the transmitting module 13 or the receiving module can also be attained.

Embodiment 2

Figure 5A:
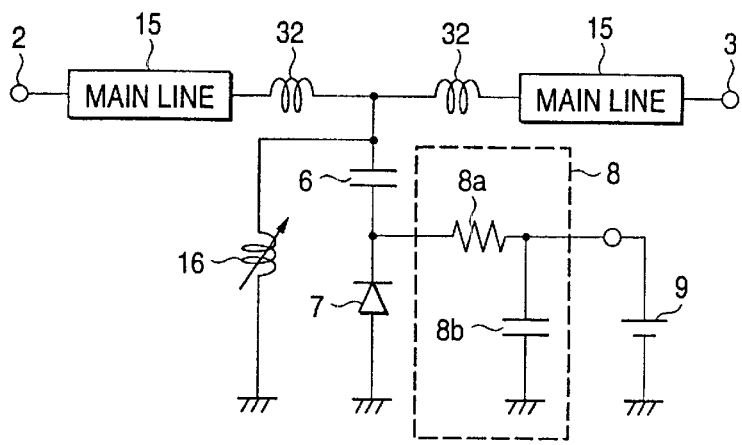
FIGS. 5A and 5B are views showing a phase compensation circuit according to an embodiment 2 of the present invention.
Figure 5B:
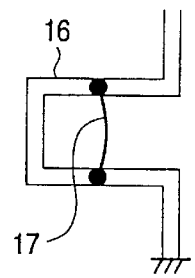

FIGS. 5A and 5B are views showing a configuration of a phase compensation circuit according to an embodiment 2 of the present invention. A reference 17 denotes a metal thin line. As shown in FIG. 5A, basically this phase compensation circuit is similar to the phase compensation circuit in the embodiment 1 shown in FIG. 1, but a variable inductor is employed as the second inductive element 16 in this phase compensation circuit.

An example of a means for varying the inductance of the second inductive element 16 is shown in FIG. 5B. If the second inductive element 16 is formed by the microstrip line like the J-shape and then two points of the second inductive element 16 are connected by the metal thin line 17, as shown in FIG. 5B, the inductance can be varied easily.

Figure 6A:
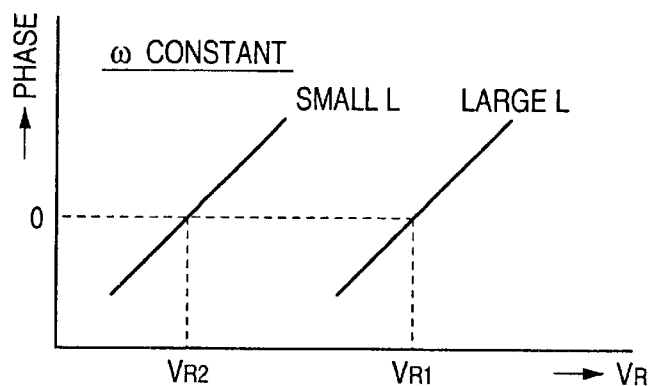
FIGS. 6A and 6B are views showing an example of a microwave characteristic of the phase compensation circuit in the embodiment 2 of the present invention.
Figure 6B:
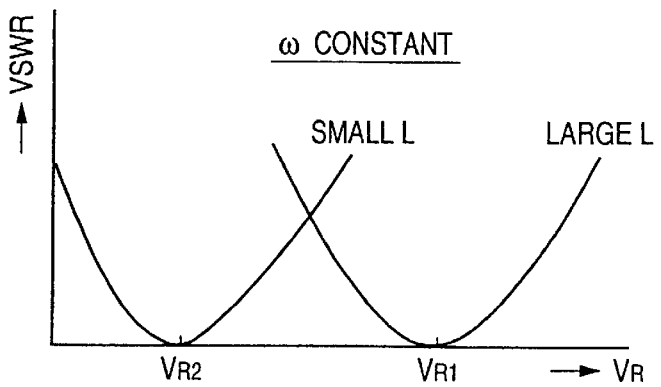

FIGS. 6A and 6B show the phase characteristic and the VSWR characteristic of the phase compensation circuit respectively when the inductance L of the second inductive element 16 in the phase compensation circuit shown in FIG. 5 is varied. In FIGS. 6A and 6B, the angular frequency ω is assumed constant.

Like the embodiment 1 of the present invention, an equivalent circuit of this phase compensation circuit can be expressed, as shown in FIG. 2. It is evident from this equivalent circuit that, in order to keep the resonance frequency constant, a value of the variable capacity element 7 must be changed according to the inductance of the second inductive element 16.

More particularly, since the junction capacitance Cj of the variable capacity element 7 becomes small if the inductance L of the second inductive element 16 is large, the parallel resonance is caused at the high voltage VR1. Conversely, since the junction capacitance Cj of the variable capacity element 7 becomes large if the inductance L of the second inductive element 16 is small, the parallel resonance is caused at the low voltage VR2.

Accordingly, the phase characteristic shown in FIG. 6A and the VSWR characteristic shown in FIG. 6B can be derived depending upon the inductance L. Thus, the phase compensation of the transmitting module 13 or the receiving module can also be attained by applying this phase compensation circuit.

As described above, the inductance of the second inductive element 16 can be varied in the phase compensation circuit in the embodiment 2. Even if the junction capacitance Cj characteristic of the variable capacity element 7 relative to the VR shown in FIG. 3 is varied, the parallel resonance characteristic can be obtained at the desired voltage VR by varying the inductance of the second inductive element 16.

Accordingly, there is no necessity that the applied voltage must be set according to variation in the characteristic of the variable capacity element 7 employed in the phase compensation circuit, and the voltage variable range employed to compensate the phase can be fixed. Therefore, such advantages can be achieved that a control circuit used to obtain the voltage can be simplified and thus the lower cost of the radar system or the communication system can be implemented.

Embodiment 3

Figure 7A:
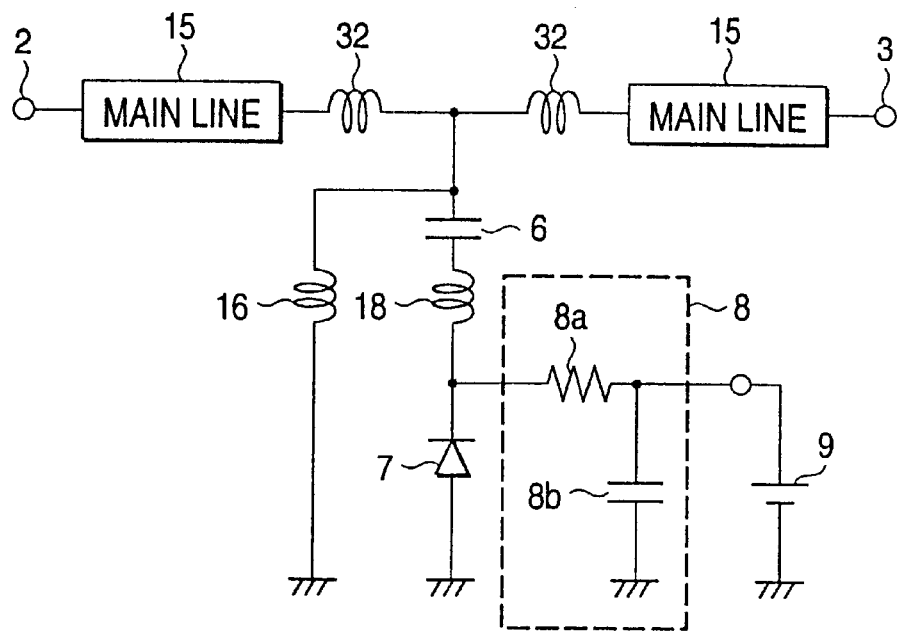
FIGS. 7A and 7B are views showing a configuration and an equivalent circuit of a phase compensation circuit according to an embodiment 3 of the present invention.
Figure 7B:
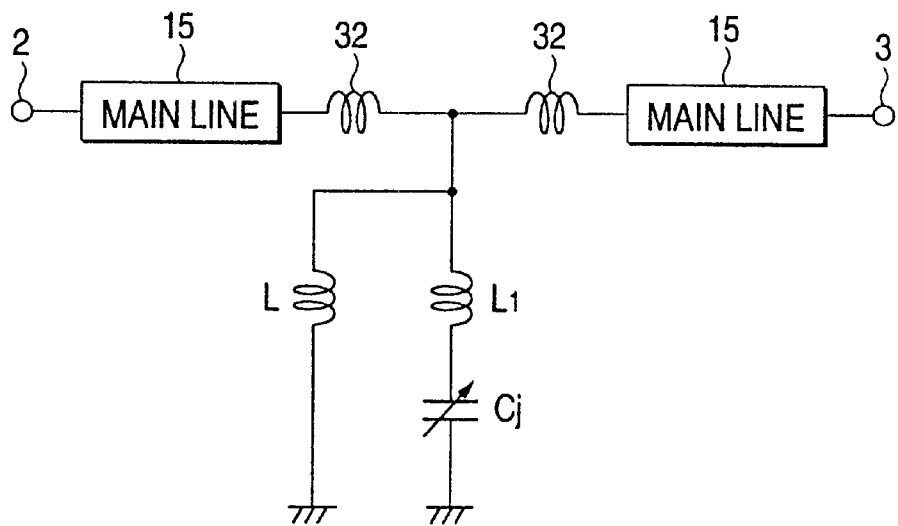

FIGS. 7A and 7B are views showing a configuration and an equivalent circuit of a phase compensation circuit according to an embodiment 3 of the present invention. As shown in FIG. 7A, in this phase compensation circuit, a third inductive element 18 is provided between the capacitor 6 and the variable capacity element 7 in the embodiment 1. As shown in FIG. 7B, an equivalent circuit of the phase compensation circuit can be expressed by connecting an inductance L due to the second inductive element 16 in parallel with a series circuit which consists of an inductance L1 due to the third inductive element 18 and a junction capacitance Cj due to the variable capacity element A value of the inductance L1 of the third inductive element 18 is selected such that a series resonance frequency between the junction capacitance Cj and the inductance L1 can be increased higher than a predetermined frequency. Thus, this series circuit can be regarded equivalently as a capacitor in a predetermined frequency band.

Figure 8A:
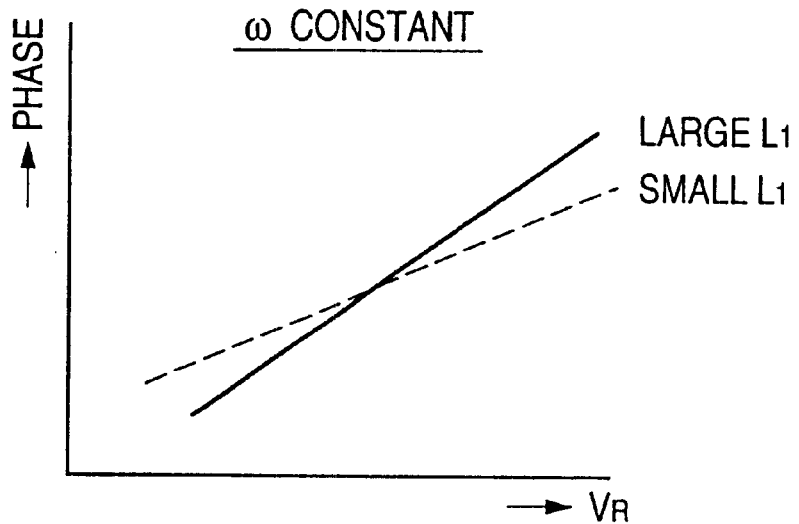
FIGS. 8A and 8B are views showing an example of a microwave characteristic of the phase compensation circuit in the embodiment 3 of the present invention.
Figure 8B:
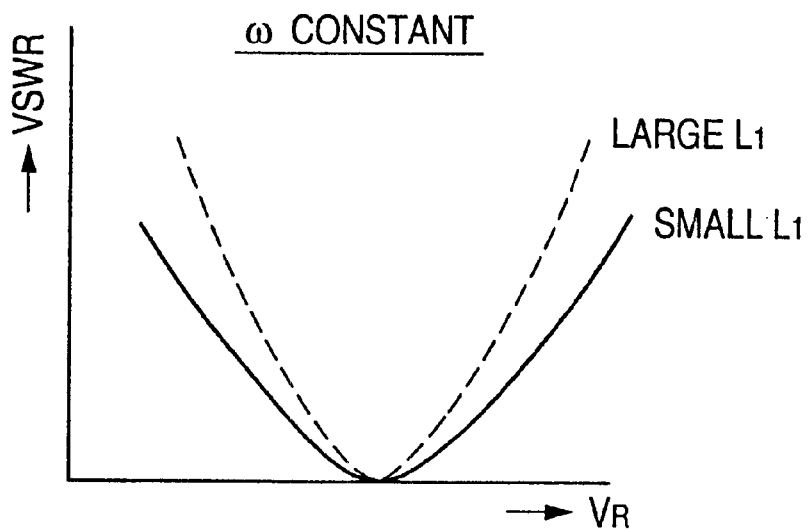

Therefore, if the inductance L of the second inductive element 16 which can parallel-resonate with the capacitor of this equivalent series circuit at the predetermined frequency is selected, the phase characteristic and the VSWR characteristic can be derived as shown in FIGS. 8A and 8B respectively. If the inductance L1 of the third inductive element 18 is increased to set the resonance frequency of the series circuit close to the predetermined frequency band, Q of the phase compensation circuit is increased. Thus, an inclination of the phase relative to the voltage VR of the direct current power supply 9 becomes sharp, as indicated by a solid line in FIG. 8A, and the VSWR band becomes narrow, as indicated by a broken line in FIG. 8B. On the contrary, if the inductance L1 of the third inductive element 18 is decreased, the inclination of the phase becomes gentle, as indicated by a broken line in FIG. 8A, and the VSWR band becomes wide, as indicated by a solid line in FIG. 8B.

As described above, in the phase compensation circuit in the embodiment 3, the inclination of the phase can be varied by the third inductive element 18 which is incorporated in series with the variable capacity element 7. For this reason, under the condition that the setting voltage and the voltage variable range of the direct current power supply 9 are fixed but the phase change in the transmitting module 13 or the receiving module relative to the temperature is varied, the phase compensation can be achieved. As a result, there can be achieved advantages such that a cost of the control circuit for applying the desired voltage to the variable capacity element 7 can be lowered and also more precise phase compensation can be attained.

Embodiment 4

Figure 9A:
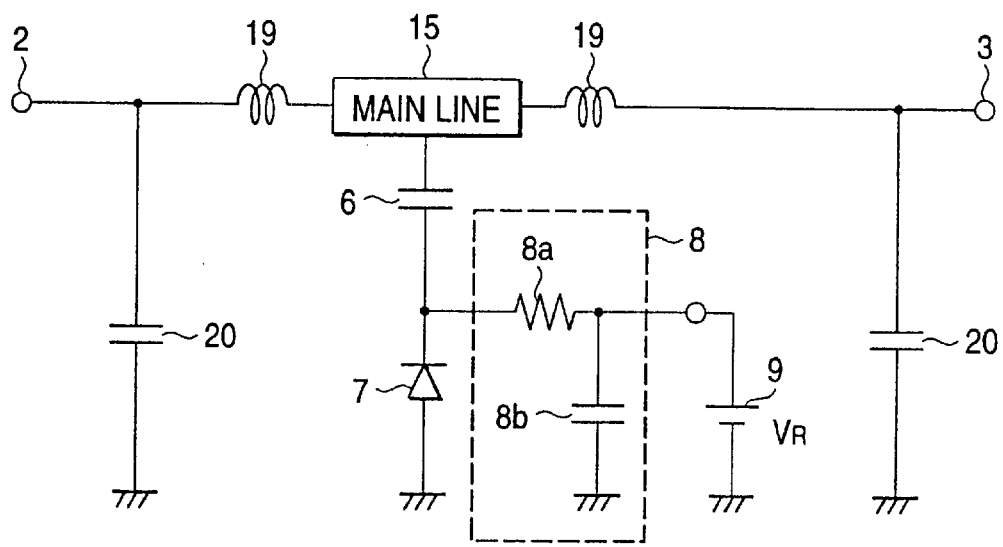
FIGS. 9A and 9B are views showing a configuration and an equivalent circuit of a phase compensation circuit according to an embodiment 4 of the present invention.
Figure 9B:
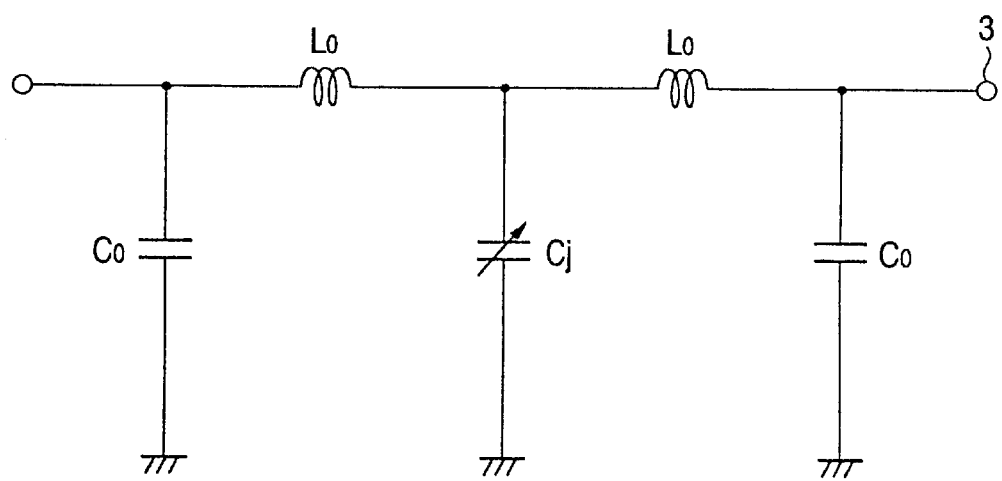

FIGS. 9A and 9B show a configuration and an equivalent circuit of a phase compensation circuit according to an embodiment 4 of the present invention respectively. As shown in FIG. 9A, this phase compensation circuit comprises the series circuit of the capacitor 6 and the variable capacity element 7, which are provided between the main line 15 for passing the signal and ground, the choke circuit 8 provided between the capacitor 6 and the variable capacity element 7 of the series circuit, two inductors 19 which are provided in series with the main line 15 respectively, and two capacitors 20 which are provided between one end of the inductor 19 on the input terminal 2 side and ground and between one end of the inductor 19 on the output terminal 3 side and ground respectively.

In this case, if a value of the capacitor 6 is selected sufficiently large rather than the junction capacitance Cj of the variable capacity element 7 and a value of the inductor 19 is assumed as L0 and a value of the capacitor 20 is assumed as C0, an equivalent circuit of the phase compensation circuit can be expressed as shown in FIG. 9B. In other words, this equivalent circuit provides a low-pass filter circuit.

If the value C0 of the capacitor 20 is selected substantially equal to the junction capacitance Cj and also the value L0 of the inductor 19 is selected as L0=Z0×Z0×C0, impedances at the input terminal 2 and the output terminal 3 are substantially equal to the power supply impedance or the load impedance Z0. In other words, the phase compensation circuit which has the good VSWR over the wideband can be implemented.

In this case, the junction capacitance Cj of the variable capacity element 7 can also be varied by the voltage supplied from the direct current power supply. If the voltage is increased, the junction capacitance Cj is reduced smaller and the phase leads more and more. Accordingly, the phase compensation in the transmitting module or the receiving module can be executed.

As described above, there is such an advantage that, if the low-pass filter circuit is formed as the phase compensation circuit, the very wide band can be achieved rather than the parallel resonance circuits described above in the embodiment 1 to the embodiment 3.

Embodiment 5

Figure 10:
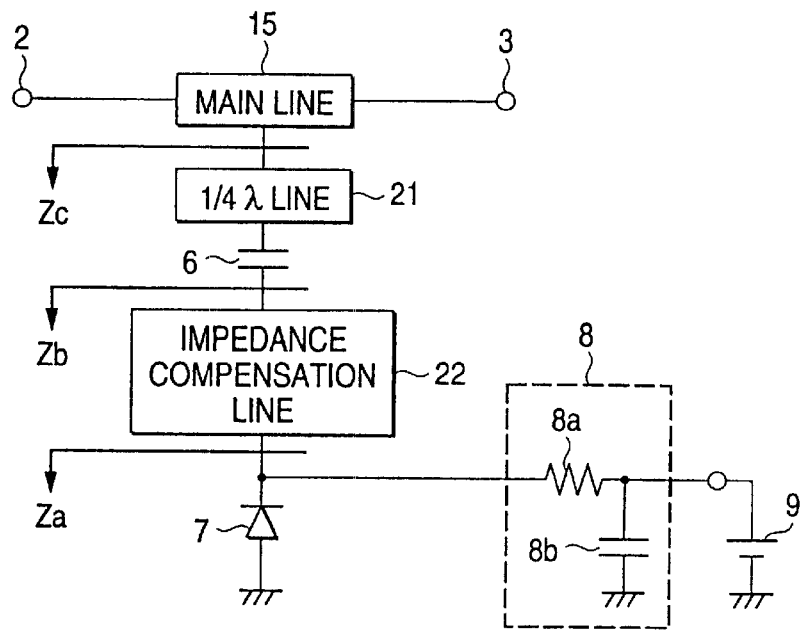
FIG. 10 is a view showing a configuration of a phase compensation circuit according to an embodiment 5 of the present invention.

FIG. 10 is a view showing a configuration of a phase compensation circuit according to an embodiment 5 of the present invention. In this phase compensation circuit, a series circuit which consists of a ¼λ line 21, the capacitor 6, an impedance compensation line 22, and the variable capacity element 7 is provided between the main line 15 on which the signal is passed and ground, and also the choke circuit 8 is provided between the impedance compensation line 22 and the variable capacity element 7.

In FIG. 10, Za denotes an example of the impedance of the variable capacity element 7, Zb denotes an impedance obtained when the variable capacity element 7 side is viewed from a connecting portion between the capacitor 6 and the impedance compensation line 22, and Zc denotes an impedance obtained when the variable capacity element 7 side is viewed from a connecting portion between the main line 15 and the ¼λ line 21.

Figure 11:
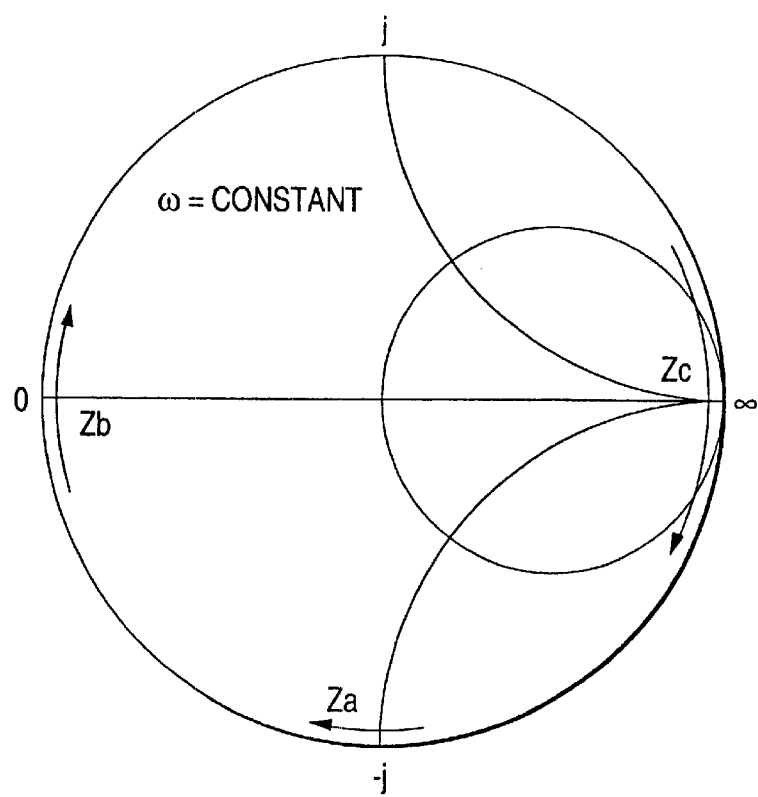
FIG. 11 is a view showing an impedance locus of the phase compensation circuit in the embodiment 5 of the present invention.

FIG. 11 is a view showing an impedance locus at respective points of the phase compensation circuit in FIG. 10. FIG. 11 shows the case where the angular frequency ω is kept constant but the voltage VR applied to the variable capacity element 7 is changed from VR1 to VR2. The impedance Za of the variable capacity element 7 is depicted in a lower area of the Smith chart, i.e., such impedance Za is capacitive. When the impedance compensation line 22 is Interposed, this impedance Za is shifted to the low impedance Zb on the real axis, as shown in FIG. 11. In other words, the impedance compensation line 22 is used to shift the impedance Za onto the real axis which has the low impedance. In addition, when the ¼λ line 21 is interposed, the low impedance Zb is shifted to the high impedance Zc on the real axis.

In this manner, impedance transformation from Za to Zc can be achieved by employing the ¼λ line 21 and the impedance compensation line 22. Thus, good VSWR can be maintained at the input terminal 2 or the output terminal 3. In this phase compensation circuit, phase compensation of the transmitting module 13 or the receiving module can be attained by varying the junction capacitance Cj of the variable capacity element 7.

As described above, in the phase compensation circuit of the embodiment 5 of the present invention, since the impedance Za of the variable capacity element 7 is transformed up to the high impedance Zc by employing the ¼λ line 21 and the impedance compensation line 22, the phase compensation can be attained while keeping the good VSWR. In particular, there is such an advantage that, since the phase compensation circuit can be formed easily into a suitable shape in the high-frequency band by utilizing the microwave integrated circuit technology to form transmission lines such as the ¼λ line 21, the impedance compensation line 22, etc., the production cost of the phase compensation circuit can be reduced.

Embodiment 6

Figure 12:
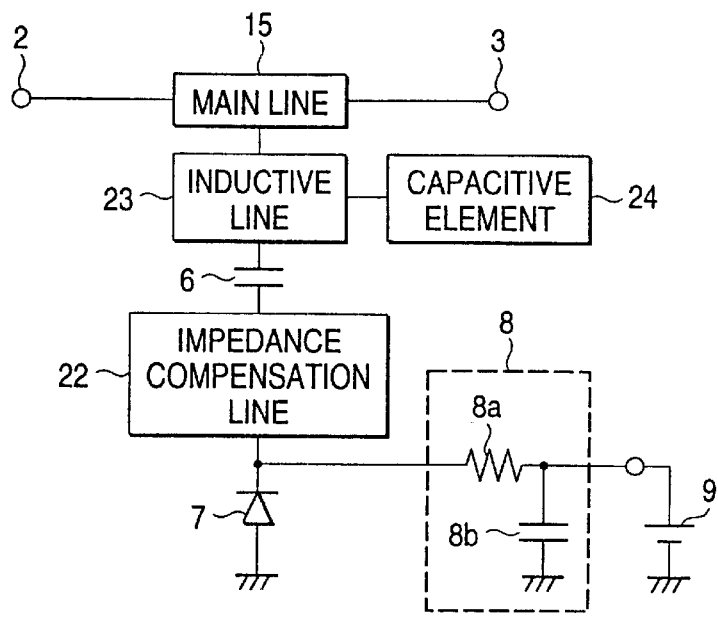
FIG. 12 is a view showing a configuration of a phase compensation circuit according to an embodiment 6 of the present invention.

FIG. 12 is a view showing a configuration of a phase compensation circuit according to an embodiment 6 of the present invention. In this phase compensation circuit, an inductive line 23 whose length is shorter than ¼λ is employed in place of the ¼λ line 21 shown in the embodiment 5 of the present invention, and then a capacitive element 24 is connected in the almost center area of the inductive line 23.

The capacitive element 24 can be easily implemented by the open-ended line. The capacitive element 24 acts to lag the phase of the signal passing through the inductive line 23. The phase of the signal lags much more as a length of the capacitive element 24 becomes longer. Therefore, if the length of the capacitive element 24 is selected to a desired value, an electric length of the inductive line 23 can be set to 90 degree, which is identical to the ¼λ line 21. In this way, if the inductive line 23 and the capacitive element 24 are employed in combination, they can have equivalently the substantially same operation as the ¼λ line 21, so that the phase compensation can be achieved as in the embodiment 5.

As described above, in the phase compensation circuit of the embodiment 6, since the inductive line 23 and the capacitive element 24 are employed in combination in place of the ¼λ line 21 and also the length of the capacitive element 24 is varied, the phase of the signal passing through the inductive line 23 can be changed.

Accordingly, there can be achieved an advantage that the phase compensation circuit which enables the impedance compensation even if the characteristic of the variable capacity element 7 is varied and also yields the good VSWR characteristic can be implemented.

In the above embodiments, the cases where the phase compensation circuit is applied to phase compensation in the transmitting module 13 or the receiving module have been described. However, cases where the phase compensation circuit is applied to a local signal system of the frequency converter device will be explained hereinafter.

Embodiment 7

Figure 13:
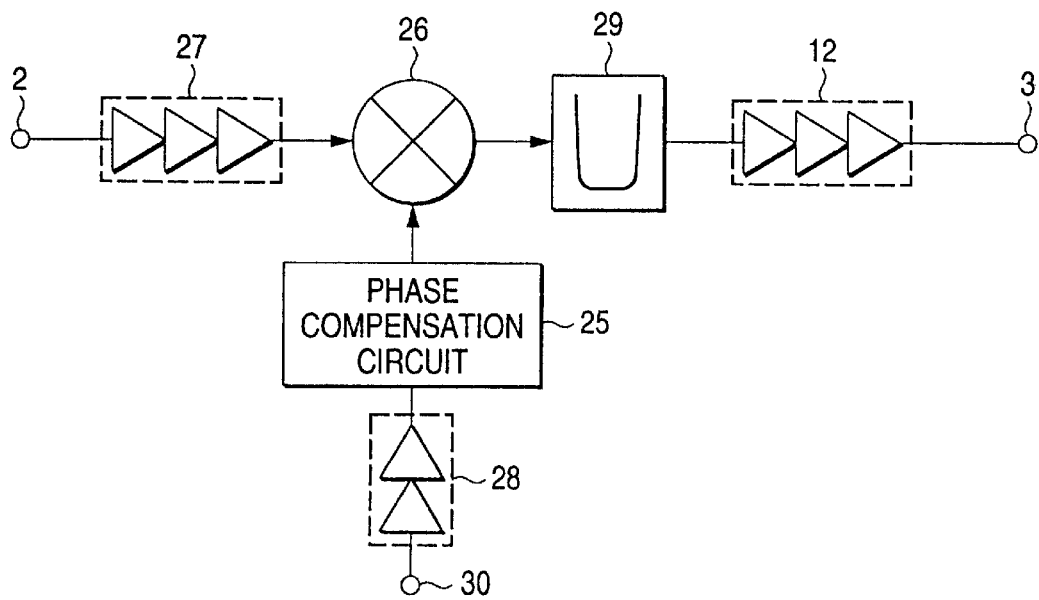
FIG. 13 is a view showing a configuration of a frequency converter device using the phase compensation circuit of the present invention.

FIG. 13 is a view showing an example of a configuration of a frequency converter device according to an embodiment 7 of the present invention. In FIG. 13, a reference 25 denotes a phase compensation circuit set forth in any one of embodiments 1 to 6; 26, a mixer; 27, an intermediate-frequency amplifier; 28, a local signal amplifier; 29, a filter; 12, a high-frequency amplifier; and 30, a local signal terminal.

This frequency converter device is constructed by connecting the intermediate-frequency amplifier 27, the local signal amplifier 28 and the phase compensation circuit 25, and the high-frequency amplifier 12 to the IF terminal, the local terminal, and the RF terminal of the mixer 26 respectively.

According to such configuration, the IF signal being input from the input terminal 2 in the low frequency band is amplified by the intermediate-frequency amplifier 27 and then input into the mixer 26. Meanwhile, the local signal being input to the local signal terminal 30 is amplified by the local signal amplifier 28 and then input into the mixer 26 via the phase compensation circuit 25. The IF signal and the local signal are mixed by the mixer 26 and then converted into the higher frequency RF signal. Then, the RF signal is passed through the filter 29 and the high-frequency amplifier 12 and then output from the output terminal 3.

In general, since semiconductor devices are employed as the mixer 26, the intermediate-frequency amplifier 27, the local signal amplifier 28, and the high-frequency amplifier 12 constituting this frequency converting device, the phase of the passing signal is largely changed relative to the temperature. The phase tends to lag as the temperature is increased. The lag in phase from the input terminal 2 to the output terminal 3 can be given by a sum of respective phase lags in the mixer 26 and the amplifiers 12, 27, 28.

Also, the IF signal occupies the frequency band in the frequency converting device of this type, while the local signal occupies no frequency band, i.e., in many cases the local signal is fixed at a certain frequency.

Therefore, in the frequency converting device of the present invention, the phase compensation circuit 25 is provided in the local signal system which does not need the wideband property. As shown in the embodiment 1 to the embodiment 6, the phase tends to lead in the phase compensation circuit 25 by increasing the voltage applied to the variable capacity element 7. As a result, if the voltage applied to the variable capacity element 7 is increased with the increase of the temperature, the phase lag in the mixer 26 and the amplifiers 12, 27, 28 can be compensated.

As described above, it is possible to compensate the phase in the frequency converting device with respect to the temperature by providing the phase compensation circuit 25 in the local signal system which does not need the wideband property. There is an advantage that, since merely one variable capacity element 7 is needed in the phase compensation circuit 25 employed herein, reduction in cost of the frequency converting device can be achieved. In addition, there is another advantage that, since the phase compensation circuit 25 has a very simple configuration, reduction in size of the frequency converting device can also be achieved.

In the above embodiment 7, the up-converter which converts the frequency of the IF signal into the higher frequency of the RF signal has been disclosed. But the same advantage can be achieved by the down-converter which converts the RF signal into the IF signal.

Embodiment 8

Figure 14A:
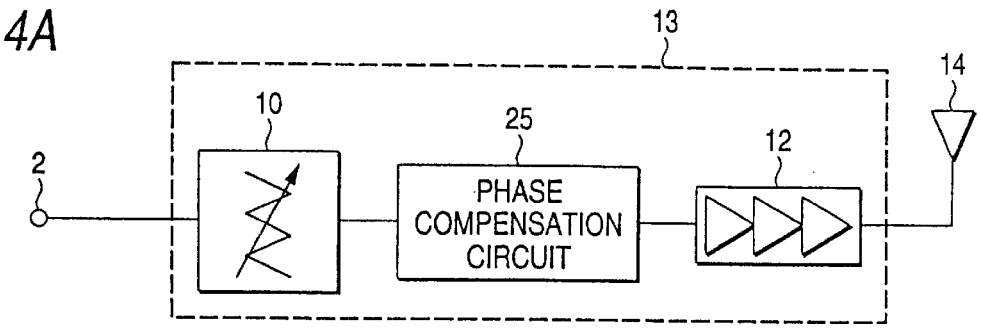
FIGS. 14A and 14B are block diagrams showing one constituent element of an active phased array antenna to which a transmitting module and a frequency converter device, which have the phase compensation circuit of the present invention, are applied.

FIG. 14A is a block diagram showing one constituent element of an active phased array antenna according to an embodiment 8 of the present invention. In this antenna, the transmitting module 13 to which any one of the phase compensation circuits disclosed in the embodiment 1 to the embodiment 6 is applied is employed.

As described above, the phase compensation circuit 25 which has a simple configuration using one variable capacity element 7 is employed in the transmitting module 13. Hence, the phase compensation circuit is low in cost and small rather than the conventional transmitting module 13 using the phase shifter 11.

Especially, in the antenna which uses a number of transmitting modules 13 like the active phased array antenna, reduction in size and reduction in cost can be attained remarkably.

Embodiment 9

Figure 14B:
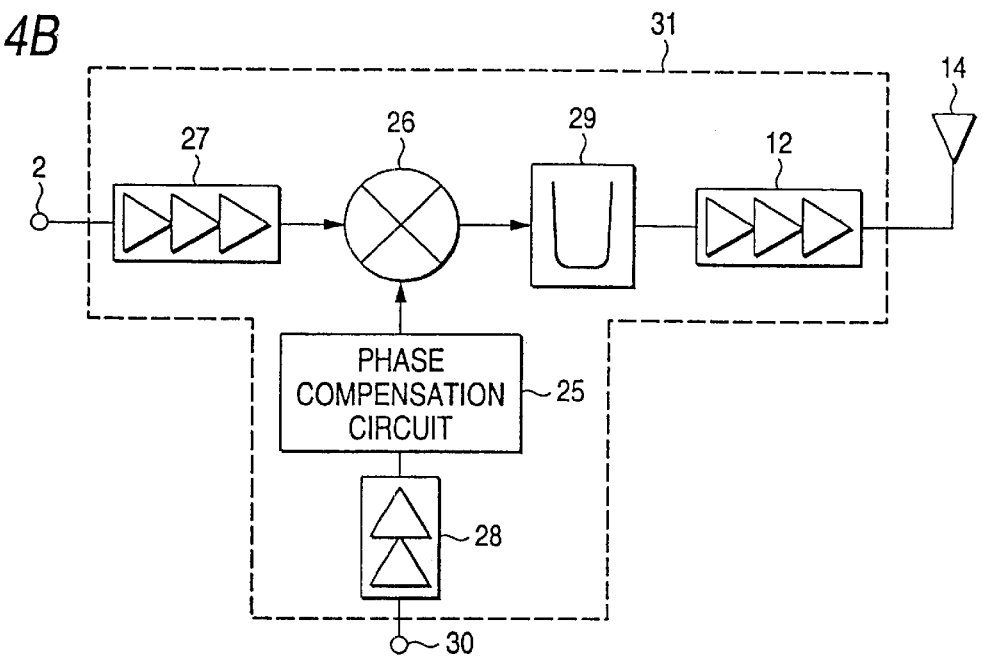
Figure 15:
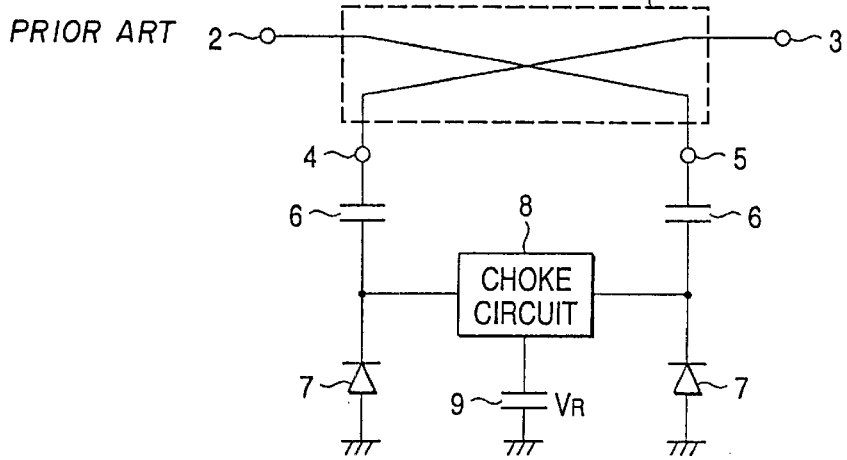
FIG. 15 is a view showing a configuration of the phase shifter in the prior art.
Figure 16A:
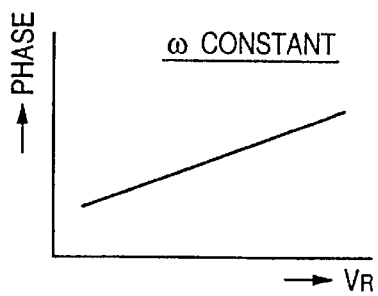
FIGS. 16A to 16C are views showing an example of a microwave characteristic of the phase shifter in the prior art.
Figure 16B:
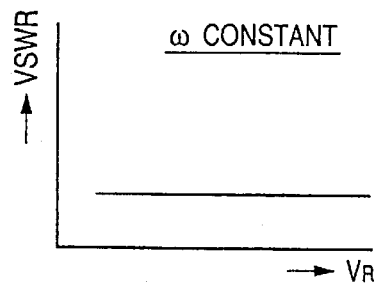
Figure 16C:
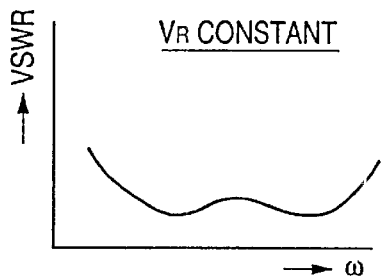
Figure 17:
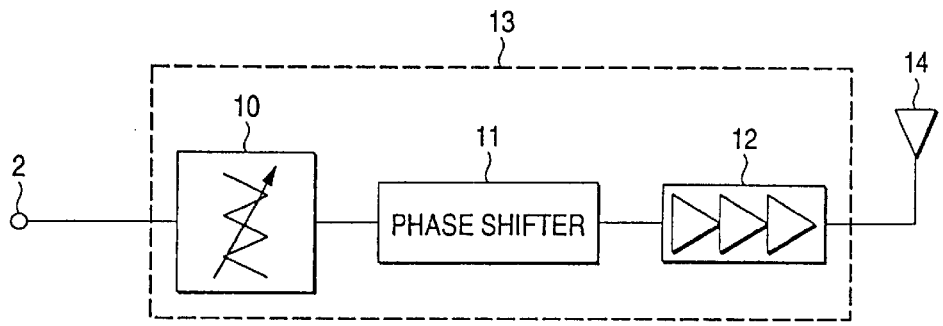
FIG. 17 is a block diagram showing one constituent element of an active phased array antenna to which the transmitting module having the phase shifter in the prior art is applied.

FIG. 14B is a block diagram showing one constituent element of an active phased array antenna according to an embodiment 9 of the present invention. In this antenna, a frequency converter device 31 is employed in place of the transmitting module 13 shown in the embodiment 8.

In this frequency converter device 31, any one of the phase compensation circuits 25 disclosed in the embodiment 1 to the embodiment 6 is applied. In this case, reduction in size and reduction in cost of the antenna can also be achieved.

In FIGS. 14A and 14B, the case where the phase compensation circuit 25 is applied to the transmitting module 13 and the frequency converter device 31 respectively and then the transmitting active phased array antenna is constructed by using the transmitting module 13 and the frequency converter device 31 has been described. In the event that the phase compensation circuit 25 is applied to the receiving module and the down-converter and then the receiving active phased array antenna is constructed, the present invention can achieve the same advantages.

According to the first aspect of the invention, two first inductive elements are incorporated in series with the main line through which the signal is passed, then the series circuit of the capacitor and the variable capacity element is provided between the connecting point of two first inductive elements and ground, then the second inductive element is connected in parallel with the series circuit, and then the choke circuit is provided between the capacitor and the variable capacity element. Therefore, if the voltage applied to the variable capacity element is increased with the increase of the temperature, the phase compensation in the transmitting module or the receiving module relative to the temperature can be achieved. Also, since the phase compensation circuit has the simple configuration using one variable capacity element, it is possible to achieve the advantage that reduction in cost and reduction in size can be accomplished.

According to the second aspect of the invention, since the value of the second inductive element disclosed in the first invention can be set to be varied, there is no need to vary the applied voltage based on variation in the characteristic of the variable capacity element, and thus the voltage variable range to compensate the phase can be fixed. Therefore, there are advantages that the voltage controlling circuit can be simplified and thus the phase compensation circuit can be implemented at lower cost.

According to the third aspect of the invention, since the third inductive element is provided between the variable capacity element and the capacitor disclosed in the first invention, the inclination of the phase relative to the applied voltage can be varied. Therefore, the setting voltage and the voltage variable range of the direct current power supply can be fixed, and also the phase compensation can be accomplished even though the phase change in the transmitting module and the receiving module relative to the temperature is varied. As a result, the voltage controlling circuit can be fabricated at lower cost and also the more precise phase compensation can be achieved.

According to the fourth aspect of the invention, the series circuit of the capacitor and the variable capacity element is provided between the main line and ground, then the choke circuit is provided between the capacitor and the variable capacity element of the series circuit, then the inductor is connected in series with the main line, and then the capacitor is provided between the inductor and ground. Therefore, the phase compensation circuit which makes possible the good VSWR characteristic over the wide band can be obtained at low cost.

According to the fifth aspect of the invention, the series circuit which consists of the ¼λ line, the capacitor, the impedance compensation line, and the variable capacity element is provided between the main line and ground, then the choke circuit is provided between the impedance compensation line and the variable capacity element, and then the microwave integrated circuit technology is applied. Therefore, there is an advantage that, since the phase compensation circuit with a suitable size can be implemented in the high frequency band, the production cost of the phase compensation circuit can be reduced.

According to the sixth aspect of the invention, the inductive line and the capacitive element being connected to the inductive line are employed instead of the ¼λ line disclosed in the fifth invention. Therefore, since the electric length of the inductive line can be equivalently varied by changing the length of the capacitive element, the phase compensation circuit with the good VSWR characteristic can be implemented even though the characteristic of the variable capacity element is varied. In addition, there is such an advantage that, since the microwave integrated circuit technology can be easily applied to the phase compensation circuit, the production cost of the phase compensation circuit can be reduced.

According to the seventh aspect of the invention, there are such advantages that, since any one of the phase compensation circuits disclosed in the first to sixth inventions is provided in the local signal system of the frequency converter device, the phase compensation can be carried out without degradation of the characteristic of the frequency converter device and also the small frequency converter device can be fabricated at lower cost.

According to the eighth aspect of the invention, since any one of the phase compensation circuits disclosed in the first to sixth inventions is applied to the transmitting module or the receiving module and then the active phased array antenna can be constructed by using the module, reduction in cost and reduction in size of the antenna can be achieved remarkably.

According to the ninth aspect of the invention, since any one of the phase compensation circuits disclosed in the first to sixth inventions is applied to the frequency converter device and then the active phased array antenna can be constructed by using the frequency converter device, reduction in cost and reduction in size of the antenna can be achieved remarkably.

What is claimed is:

1. A phase compensation circuit comprising:
   two first inductive elements connected in series with a main line through which a signal is passed;
   a series circuit consisting of a capacitor and a variable capacity element, the capacitor having one end connected to a connecting point between the first inductive elements and the variable capacity element having one end connected to ground;
   a second inductive element connected in parallel with the series circuit; and
   a choke circuit connected between the capacitor and the variable capacity element of the series circuit.

2. A phase compensation circuit according to claim 1, wherein an inductive element whose inductance can be varied is employed as the second inductive element.

3. A frequency converter device comprising:
   the phase compensation circuit which is set forth in claim 2 and employed in a local signal system of the frequency converter device.

4. An active phased array antenna comprising:
   transmitting modules or receiving modules each of which includes the phase compensation circuit set forth in claim 2.

5. A phase compensation circuit according to claim 1, further comprising:
   a third inductive element provided between the capacitor and the variable capacity element of the series circuit.

6. A frequency converter device comprising:

the phase compensation circuit which is set forth in claim 5 and employed in a local signal system of the frequency converter device.

7. An active phased array antenna comprising:

transmitting modules or receiving modules each of which includes the phase compensation circuit set forth in claim 5.

8. A frequency converter device comprising:

the phase compensation circuit which is set forth in claim 1 and employed in a local signal system of the frequency converter device.

9. An active phased array antenna comprising:

the frequency converter device set forth in claim 8.

10. An active phased array antenna comprising:

transmitting modules or receiving modules each of which includes the phase compensation circuit set forth in claim 1.

11. A phase compensation circuit comprising:

a series circuit consisting of a first capacitor and a variable capacity element, the first capacitor having one end connected to a main line through which a signal is passed and the variable capacity element having one end connected to ground;

a choke circuit connected between the first capacitor and the variable capacity element of the series circuit;

an inductor connected in series with the main line; and a second capacitor provided between the inductor and ground.

12. A frequency converter device comprising:

the phase compensation circuit which is set forth in claim 11 and employed in a local signal system of the frequency converter device.

13. A An active phased array antenna comprising:

transmitting modules or receiving modules each of which includes the phase compensation circuit set forth in claim 11.

14. A phase compensation circuit comprising:

a series circuit consisting of a ¼λ line, a capacitor, an impedance compensation line, and a variable capacity element, which are provided between a main line through which a signal is passed and ground; and a choke circuit connected between the impedance compensation line and the variable capacity element of the series circuit.

15. A frequency converter device comprising:

the phase compensation circuit which is set forth in claim 14 and employed in a local signal system of the frequency converter device.

16. An active phased array antenna comprising:

transmitting modules or receiving modules each of which includes the phase compensation circuit set forth in claim 14.

17. A phase compensation circuit comprising:

a series circuit consisting of an inductive line, a capacitor, an impedance compensation line, and a variable capacity element, which are provided between a main line through which a signal is passed and ground;

a capacitive element connected to the inductive line; and a choke circuit connected between the impedance compensation line and the variable capacity element of the series circuit.

18. A frequency converter device comprising:

the phase compensation circuit which is set forth in claim 17 and employed in a local signal system of the frequency converter device.

19. An active phased array antenna comprising:

transmitting modules or receiving modules each of which includes the phase compensation circuit set forth in claim 17.

* * * * *